United States Patent

Metzler et al.

Patent Number: 5,932,922
Date of Patent: Aug. 3, 1999

[54] UNIFORM CURRENT DENSITY AND HIGH CURRENT GAIN BIPOLAR TRANSISTOR

[75] Inventors: Richard A. Metzler, Mission Viejo; Vladimir Rodov, Redondo Beach, both of Calif.

[73] Assignee: Semicoa Semiconductors, Costa Mesa, Calif.

[21] Appl. No.: 08/818,643

[22] Filed: Mar. 14, 1997

Related U.S. Application Data

[63] Continuation-in-part of application No. 08/661,945, Jun. 11, 1996, abandoned, which is a continuation of application No. 08/287,161, Aug. 8, 1994, Pat. No. 5,554,880.

[51] Int. Cl.$^6$ ............................................. H01L 29/00
[52] U.S. Cl. ........................................ 257/560; 257/579
[58] Field of Search .................................. 257/560, 561, 257/579, 580, 563

[56] References Cited

U.S. PATENT DOCUMENTS

| | | |
|---|---|---|
| 3,460,009 | 8/1969 | Kisinko et al. . |
| 3,582,726 | 6/1971 | Gilbert et al. . |
| 5,554,880 | 9/1996 | Metzler et al. . |

FOREIGN PATENT DOCUMENTS

| | | |
|---|---|---|
| 57-181161 | 11/1982 | Japan . |
| 58-9369 | 1/1983 | Japan . |
| 61-15365 | 1/1986 | Japan . |
| 61-29173 | 2/1986 | Japan . |
| 1311446 | 3/1973 | United Kingdom . |

*Primary Examiner*—Carl Whitehead, Jr.
*Assistant Examiner*—S. V. Clark
*Attorney, Agent, or Firm*—Blakely, Sokoloff, Taylor & Zafman LLP

[57] ABSTRACT

A bipolar transistor designed to support a substantially uniform current density in base and collector regions to prevent the characteristic early fall-off of bipolar transistor current gain, and to improve the forward safe operating area performance. The advantages of the present invention are achieved by optimally spacing the neighboring emitters in relation to base thickness and further by maintaining a symmetrical topology by the self-aligned formation of emitters and base contacts. The spacing distance between the neighboring emitters does not exceed the base thickness. As a result, the current density below each emitter island is substantially uniform and the transistor as a whole can conduct a higher total current. Moreover, the transistor inhibits formation of current filaments and hot spots because the electric field in the collector region is uniform.

5 Claims, 7 Drawing Sheets

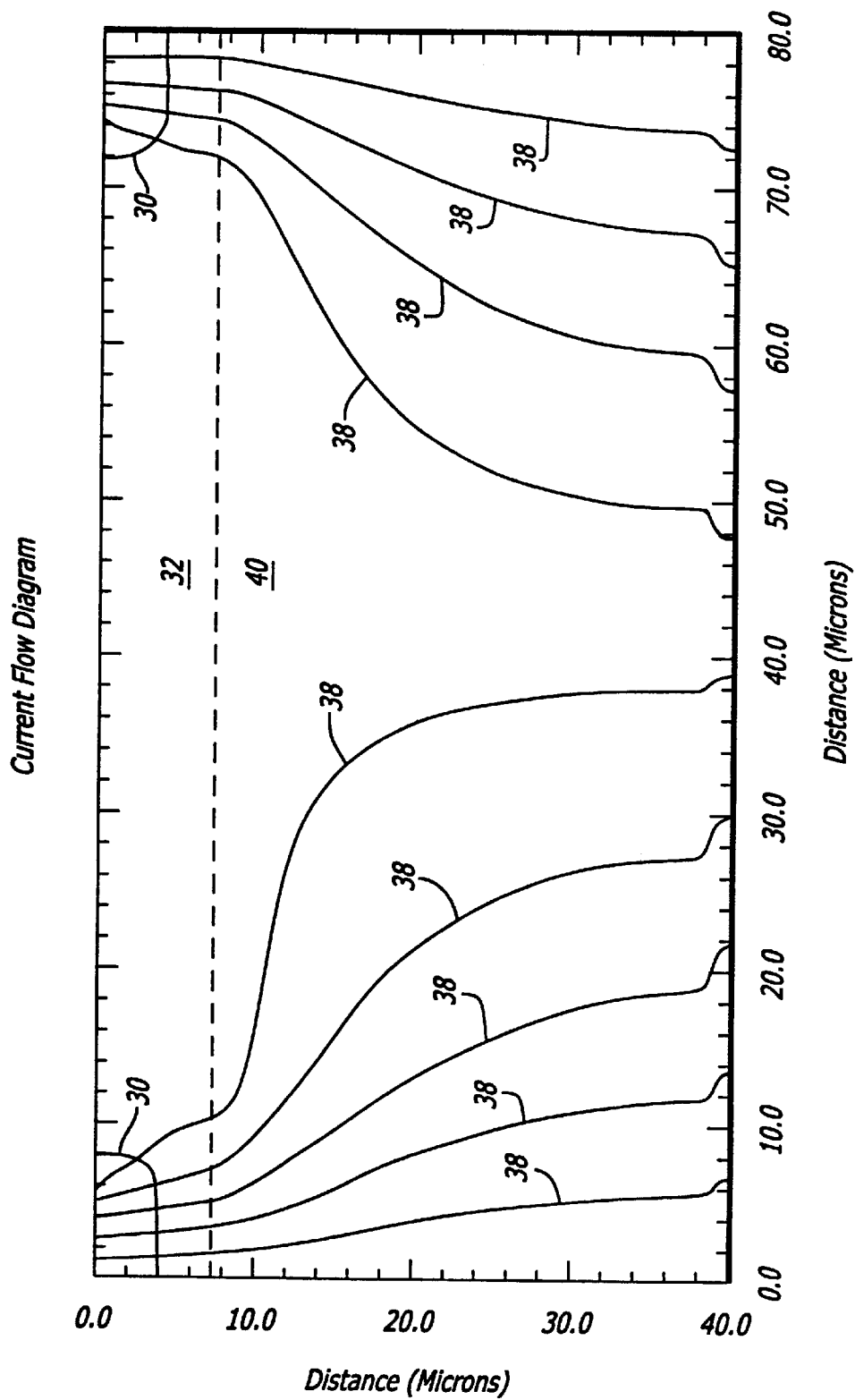

UNIFORM CURRENT DENSITY AND HIGH CURRENT GAIN BIPOLAR TRANSISTOR

CROSS-REFERENCES TO RELATED APPLICATIONS

This is a Continuation-in-Part of a U.S. Patent Application (application Ser. No. 08/661,945) filed Jun. 11, 1996, abandoned, which is a continuation of Ser. No. 08/287,161 filed Aug. 8, 1994, U.S. Pat. No. 5,554,880, issued on Sep. 10, 1996. This Application and Patent are owned by the same assignee of the present Application.

BACKGROUND OF THE INVENTION

1. Field of the Invention

The present invention relates generally to the field of bipolar power transistors.

2. Description of Art Related to the Invention

Bipolar transistors are known to have several performance limitations. One such limitation is called "emitter crowding" which results in undesired "high injection effects" in turn causing a fall-off in the magnitude of bipolar transistor current gain. A second limitation is the forward Safe Operating Area ("SOA") performance. This is a thermal instability caused by a non-uniform distribution of current in the transistor. This nonuniformity causes a localized heating effect which will augment the concentration of current, thereby causing the device to self destruct. This effect is seen in both the low and high current regimes. Emitter crowding, high injection effects, and fall-off of transistor current gain, and forward SOA performance are discussed in more detail below.

FIG. 1A illustrates a prior art bipolar transistor structure. Two base contacts 16 and 18 are shown contacting base region 12. More than one base contact is used in order to reduce the equivalent base resistance. Emitter contact 20 is shown contacting emitter island 14. Oxide layer 24 is used as an insulator. Region 22 serves as both a collector for bipolar transistor 10 and also as a substrate for transistor 10. Two resistors $r_b$ and a resistor $r'_b$ represent the distributed resistance of base 12. Because of the base distributed resistance, a forward bias placed across the emitter-base junction is not uniform and varies with position according to the voltage drop in the distributed base resistances $r_b$ and $r'_b$. In particular, the forward bias on the emitter-base junction is largest at the corners of emitter island 14, near base contacts 16 and 18.

The variation in the forward bias in the emitter-base junction is illustrated by the simplified model shown in FIG. 1B. In FIG. 1B, a PNP bipolar transistor is shown. However, it is apparent to those skilled in the art that, with a reversal of voltage polarities, the analysis below applies just as well to an NPN bipolar transistor. Point E represents emitter contact 20 and point B represent base contact 18. Point A is located at the middle of distributed resistance $r'_b$. Point D is the point at which resistors $r_b$ and $r'_b$ meet. The forward bias on the emitter-base junction at point A is approximately given by equation (1) below:

$$V_{EA} = V_{EB} - I_B (R_{AD} + R_{DB}) \quad (1)$$

However, the forward bias on the emitter-base junction at point D is given by equation (2) below:

$$V_{ED} = V_{EB} - I_B R_{DB} \quad (2)$$

Thus, $V_{ED}$ (the voltage at point D) can be significantly closer to $V_{EB}$ (the voltage applied across the emitter and base contacts) than $V_{EA}$ (the voltage at point A). Thus, the forward bias is largest at the corner of emitter 14 as opposed to its center. Accordingly, the injection of majority carriers, in this case the holes, from emitter 14 into base 12 is largest at the corners of emitter 14. This effect is called "emitter crowding," which strongly impairs the performance of bipolar transistor 10. For example, undesirable "high injection effects" become dominant at the corners of emitter 14 before the overall emitter current is very large.

The most notable undesirable high injection effect is a decrease in transistor current gain. Transistor current gain is defined as the ratio of output collector current to input base current. The primary cause of the decrease in the transistor current gain is the increase of injected emitter majority carriers, in this example the holes, into the base. As the density of excess holes injected into the base becomes large, the matching excess base electron density causes an increase in the effective doping concentration of the base. The increase in the effective doping concentration of the base causes a reduction in emitter injection efficiency. The emitter injection efficiency is the fraction of emitter current resulting from the emitter majority carrier current. The reduction in emitter injection efficiency is due to the increase of the current resulting from the emitter minority carriers, in this case the electrons, into emitter 14. The decrease in emitter injection efficiency directly reduces the collector current and hence the transistor current gain.

Thus, in the prior art bipolar transistors, transistor current gain decreases before the overall collector current is very large, primarily because of the localized domination of high injection effects at emitter corners. Curve (A) in FIG. 2 illustrates the fall-off of the prior art's bipolar transistor current gain as collector current increases. (Note that the reduction of the current gain at low collector currents shown in FIG. 2 is due to transistor phenomena which are not of interest in the present application.) Power transistors are particularly subject to the current gain impairment since power transistors are required to supply a high current output.

To applicants' knowledge, the prior art has not disclosed the solution set forth in the present invention to improve the uniformity of bipolar transistor collector current distribution and forward SOA characteristics.

Transistors are utilized in the prior art in which a multiplicity of discrete emitter areas are arranged in rows and columns and are diffused in the base layer. The emitters are made small so as to minimize the lateral base resistance effects. In order to assure uniform current distribution in the device, some devices use ballast resistors which are connected in series with the emitter islands to prevent a single emitter from carrying excess current. These resistors tend to impact high current performance by increasing the collector saturation voltage, and by increasing the gain roll-of with current.

Transistors are also utilized in the prior art in which a grid of P+ material in an NPN transistor is formed in the base layer around base areas surrounding emitter islands so as to provide greater conductivity between the base contact areas and the base material.

Gilbert, U.S. Pat. No. 3,582,726, describes a high-frequency power transistor having a plurality of discrete base areas. Base and emitter areas are grouped in columns and their contact areas extend through an insulated layer. Gilbert is directed to reducing the emitter area. Kisinko, U.S. Pat. No. 3,460,009, describes a high current gain power transistor.

However, Kisinko is directed to use of a base as thin as possible.

As exemplified by the above prior art attempts, the conventional methods to address the current gain problem focus on reducing the base depth, reducing resistance from center of the base to base contacts, and increasing emitter periphery to emitter area ratio. None of these methods has proven to be effective; the conventional bipolar transistor still has a large fall-off in current gain at high collector currents.

Thus, there is need in the art for an effective way of preserving bipolar transistor current gain at high collector currents. This need is particularly long-felt in the area of power bipolar transistors. The invention offers an effective method of fabricating a bipolar transistor, and a bipolar transistor structure, which overcome the above shortcomings of the prior art. The invention results in a transistor that substantially reduces non-uniform current density problems, and thus maintains a high current gain at high collector currents.

Another limitation in the prior art is the performance of the transistor at low voltage with high current, and at high voltage with low current. These performance points are part of the forward SOA characteristics of a transistor. The low voltage and high current regime is susceptible to current concentrating into a "filament," which is localized high concentration of current. This filament creates a localized "hot spot" which in turn will increase the current and eventually cause device failure. The high voltage and low current regime is also susceptible to the same mechanism because of the amount of heat generated by the current flow across a high potential.

The prior art employs an added resistance, called ballast resistors, in the emitters, the base, or both to prevent current from concentrating into any single point in the transistor structure, thereby providing improved SOA performance. This technique causes a degradation in the saturation voltage, and in the current gain performance. The present invention does not use any added resistance, but rather accomplishes the improved SOA performance by causing the current flow to become uniform within the base region, or collector regions adjacent to the base junction. This uniform current distribution prevents any single emitter from carrying excess current.

Thus, there is a need in the art for an effective way of increasing the SOA performance in bipolar transistors at both low and high current levels without sacrificing other performance characteristics. The invention offers an effective method of fabricating a bipolar transistor, and a bipolar transistor structure, which overcome the above shortcomings of the prior art. The invention results in a transistor which eliminates the need for ballast resistors, thereby providing improved SOA performance without the limitations caused by the added resistance of ballast resistors.

SUMMARY OF THE INVENTION

The present invention discloses method for fabricating, and the structure of, a unique and novel bipolar transistor. The bipolar transistor of the present invention has a substantially uniform current density in base and collector regions directly below the emitter region. This uniform current density prevents the characteristic early fall-off of bipolar transistor current gain. As such, the bipolar transistor of the invention increases transistor current gain at high collector currents. Since the current gain of bipolar transistors is the most important parameter of transistor performance, the advance presented by the invention is very significant in the art, especially in the art of power bipolar transistors.

The advantages of the bipolar transistor of the present invention are achieved by optimally separating the neighboring emitters from each other by an amount not to exceed the thickness of the base and further by maintaining a symmetrical topology by the self-aligned formation of emitters and base contacts. Due to this particular emitter separation distance, the current emanating from the corners of a given emitter would fill base and collector regions between adjacent emitters to provide a uniform current distribution. As such, the entire base and collector regions below the center of a given emitter conduct the emitter majority carrier current in a substantially uniform manner. Therefore, the current density below each emitter island is substantially uniform and the transistor as a whole can conduct a higher total current.

Furthermore, according to the invention, a uniform current flow is established before the carriers move out of the base region. The invented transistor inhibits formation of current filaments and hot spots because the electric field in the collector region is uniform. This results in preventing undesirable high injection effects which cause a reduction in emitter injection efficiency, and ultimately a reduction of current gain of bipolar transistors. The invention is directed to achieving an optimal emitter separation distance for which shallow bases require the emitters to be spaced more closely than they are for deep bases.

The present invention accomplishes improved safe operating area (SOA) performance by causing the current flow to become uniform within the base region, or adjacent to the base junction. This uniform current distribution prevents any single emitter from carrying excess current. As such, the invention achieves improved SOA performance without causing a degradation in the saturation voltage, and in the current gain performance of the transistor.

BRIEF DESCRIPTION OF THE DRAWINGS

FIG. 6A–6C illustrates the effects on current distribution in the base and collector regions of the transistor based on variations in separation distance between emitters of the transistor.

DESCRIPTION OF THE PREFERRED EMBODIMENT

A uniform current density bipolar transistor with improved current gain is described. In the following description, numerous specific details are set forth in detail in order to provide a more thorough understanding of the present invention. It will be apparent, however, to one skilled in the art, that the present invention may be practiced without these specific details. In other instances, well known features have not been described in detail so as not to obscure the present invention.

Figure 3:
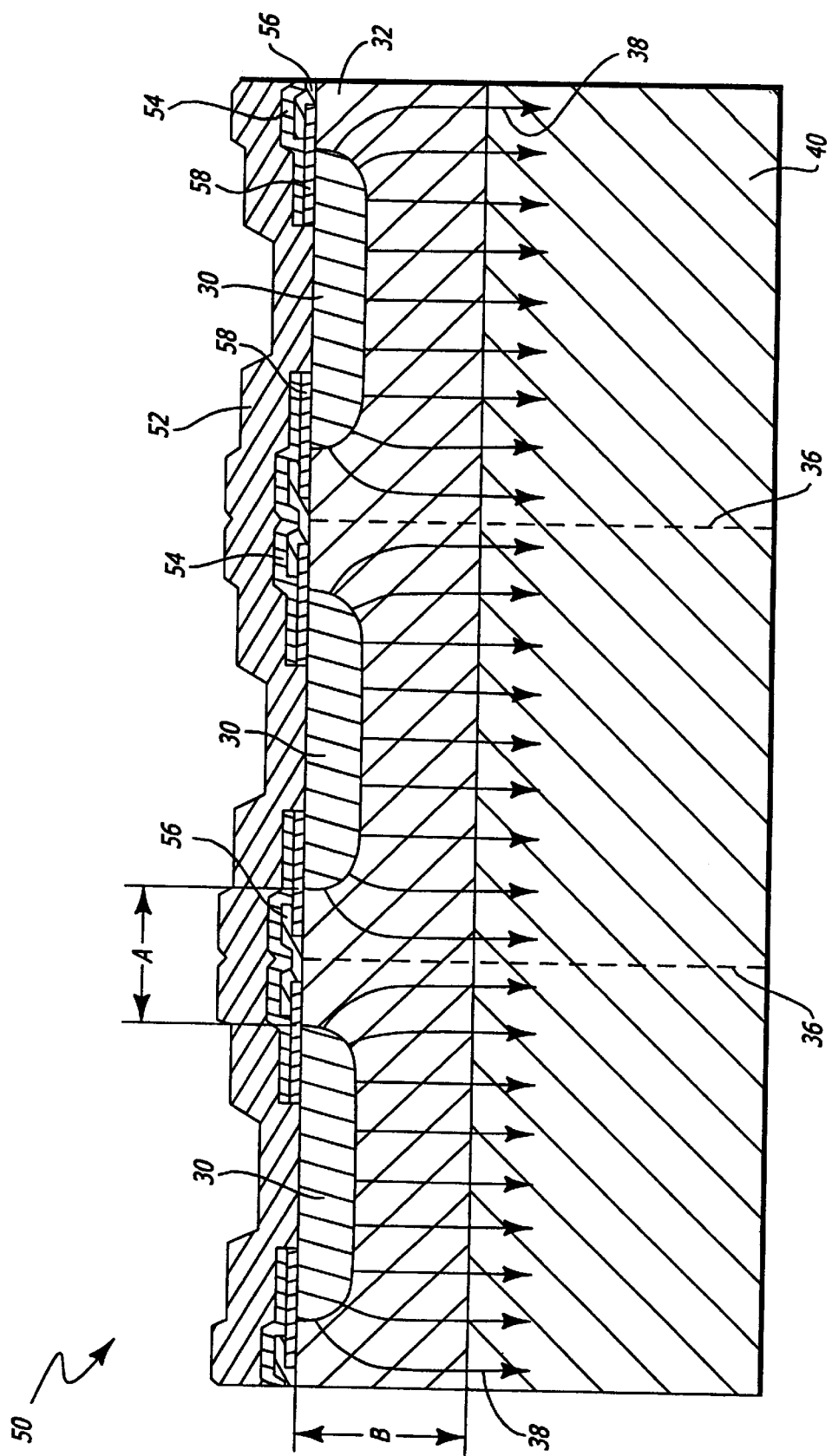
FIG. 3 is a cross-sectional view of a bipolar transistor fabricated in accordance with the present invention with illustrations of the current distribution in the base and collector regions of the transistor.

FIG. 3 illustrates a cross-sectional side view of an embodiment of a bipolar transistor 50 of the present invention. The bipolar transistor 50 includes a silicon substrate constituting the "back side" of the transistor and also acting as a collector 40. The collector 40 is typically a heavily doped N-type silicon. The N-type dopant may be arsenic, phosphorus, or antimony which can be introduced into silicon through diffusion or ion implantation as is well known in the art. The. dopant (also referred to as impurity) concentration is typically about $10^{15}$ to $10^{19}$ atoms per cubic centimeter.

Layer 32 is a P-type material and constitutes the base of bipolar transistor 50. To fabricate the P-type base, a dopant, such as boron, gallium, indium, or aluminum, is diffused or ion implanted into the silicon substrate until an impurity concentration of about $10^{15}$ to $10^{19}$ atoms per cubic centimeter is achieved. Throughout the base 32, the emitter islands 30 are distributed in a symmetrical fashion in which each emitter island 30 is separated by a fixed distance from its neighboring islands. This distribution is shown in both FIGS. 3–4.

Referring specifically to FIG. 3, patterned layer 58 is a first insulator layer which can be, for example, thermally grown or deposited silicon oxide. Patterned layer 56 is a lower metal layer providing contact to base 32. Lower metal layer 56 is prevented from extending beyond its intended region by the first insulator layer 58. Patterned layer 54 is an interlayer dielectric such as deposited silicon nitride or silicon oxide. Interlayer dielectric 54 insulates lower metal layer 56 from upper metal layer 52. Upper metal layer 52 interconnects all emitter islands. As such, lower metal layer 56 provides a base terminal for transistor 50 while upper metal layer 52 provides an emitter terminal therefor.

Figure 4:
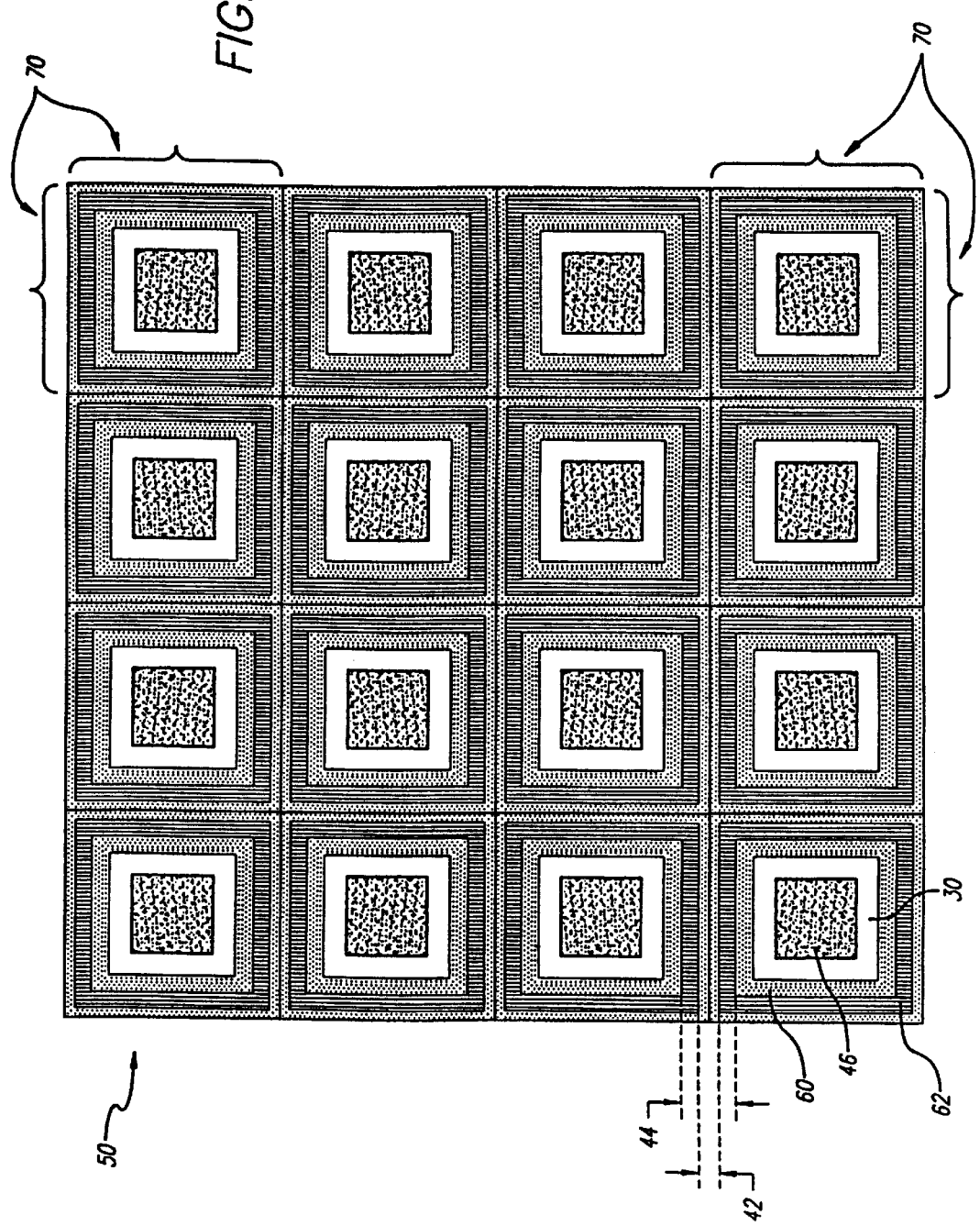
FIG. 4 shows an overhead view of the bipolar transistor featuring the processing mask overlaid on one another.

Referring now to FIG. 4, an overhead view of the layout of transistor 50 is shown in which its processing masks are overlaid on one another. The central area 46 corresponds to emitter contact mask. Central area 46 is left open so that it can ultimately be filled in by upper metal layer 52. Area 30 corresponds to emitter mask. This mask allows N-type impurities to be diffused into base 32 only in areas designated to become emitter islands 30. Area 60 belongs to a mask used to form a silicon nitride layer which is used as a shield during emitter diffusion and lower metal layer deposition. The silicon nitride layer is ultimately entirely removed and is thus not seen in FIG. 3. Area 62 belongs to a mask used to form lower metal layer 56. Lower metal layer 56 is deposited so that it extends beyond the edges of the silicon nitride layer so that it (lower metal layer 56) ultimately extends beyond the edges of first insulator layer 58 as shown in FIG. 3.

Double-arrowed line 44 in FIG. 4 indicates an area that remains filled in by lower metal layer 56 at the completion of fabrication of transistor 50. This area is also shown in FIG. 3 as extending beyond the edges of first insulator layer 58. Double-arrowed line 42 in FIG. 4 indicates an area where lower metal layer 56 contacts base 32. This area is also shown in FIG. 3 as the area occupied by lower metal layer 56, between the edges of first insulator layer 58 and contacting base 32. Each cell 70 in FIG. 4 is repeated a number of times, for example sixteen times, to make up a single transistor 50. There is only a single transistor since all emitter and base regions of cells 70 are electrically connected to other respective emitter and base regions. It is noted that FIG. 3 shows only a portion of transistor 50 which is shown in its entirety in FIG. 4 as comprising sixteen emitter islands. For clarity of illustration, FIG. 3 shows only three of these sixteen emitter islands and their corresponding layers.

Figure 5B:
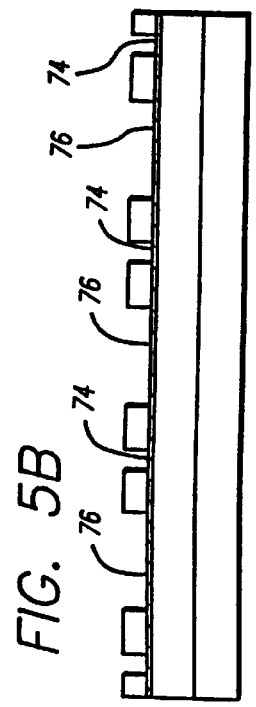
FIGS. 5A–5H illustrate the processing steps for fabricating the transistor of the present invention.
Figure 5D:
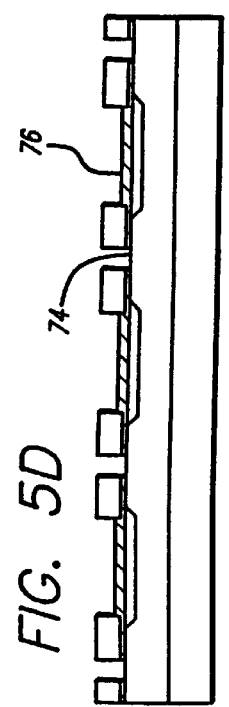
Figure 5F:
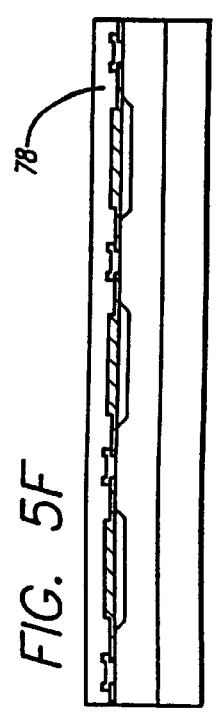
Figure 5H:
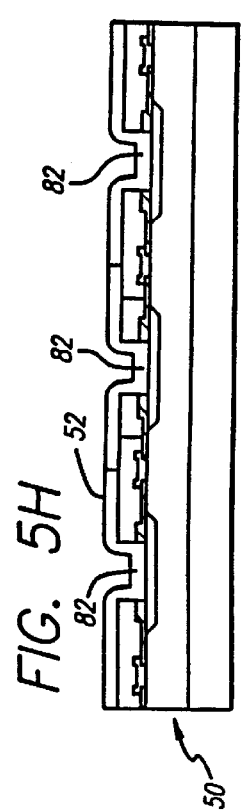
Figure 5A:
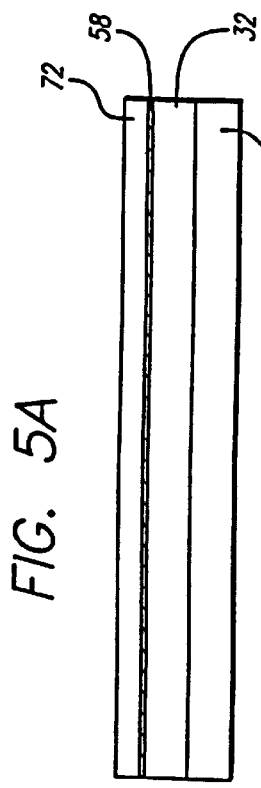

FIGS. 5A–5H illustrate the process steps for fabricating transistor 50 shown in FIG. 3. Referring initially to FIG. 5A, silicon substrate 40 is shown as the lowest layer of transistor 50. Silicon substrate 40 behaves as collector shown in FIG. 3. The substrate is typically about 15 mils thick and has an N-type impurity concentration of about $10^{15}$ to $10^{19}$ atoms per cubic centimeter. Disposed on the collector, base layer 32 is made of P-type silicon, preferably having a thickness of approximately seven microns. Base layer 32 is formed by either diffusion or ion implantation techniques known in the art.

Also shown in FIG. 5A is first insulator layer 58 which is, for example, silicon oxide. Silicon oxide layer 58 can be approximately 1000 Angstroms in thickness. The oxide layer can be thermally grown or deposited by RF sputtering techniques. A second insulator layer 72, for example, a silicon nitride layer, is evenly deposited upon insulator layer 58 as shown in FIG. 5A. The silicon nitride layer is typically about 5000 Angstroms thick and can be deposited by RF sputtering techniques.

FIG. 5B shows the structure of transistor 50 after a first mask is used to remove, for example by etching, portions of silicon nitride layer 72. Specifically, portions of the silicon nitride layer over intended emitter areas 76 and intended base contact areas 74 are removed. The remainder of nitride layer 72 will be removed in later fabrication steps. According to the invention, proper and accurate separation distance between the emitter areas and uniform distribution of base contact areas is crucial to successful operation of transistor 50.

To achieve these objectives, the invention uses a single mask, namely the mask used in this step. Accordingly, the emitter separation distance and base contact distribution are achieved through a "self-aligned" process utilizing only one mask. A second mask is then used to remove silicon oxide from the intended emitter areas 76 while leaving intact the silicon oxide on the intended base contact areas 74 (the structure of transistor 50 after completion of this step is not shown).

Figure 5C:
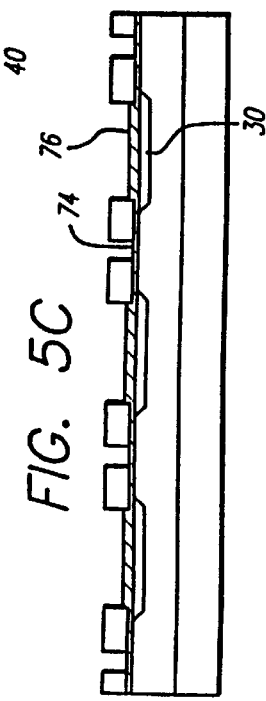

FIG. 5C shows formation of emitter islands 30 which is due to diffusion of N-type impurities into base layer 32. The N-type impurities may be, for example, arsenic atoms. In a preferred embodiment, the depth of emitter islands 30 is about four microns. A layer of silicon oxide is thermally grown over emitter areas 76. Thus, the silicon oxide removed from emitter areas 76 in the previous step is restored in this step.

During the next step, the mask used in a previous step is used again, but in reverse, to remove silicon oxide from the intended base contact areas 74 while leaving intact the silicon oxide on the emitter areas 76. Structure of transistor 50 after completion of this step is shown in FIG. 5D.

In the next step, a silicon nitride etchant is used to remove the remainder of layer 72. Thereafter, a lower metal layer 56, for example aluminum, is deposited in the base contact areas 74. According to the invention, the base contact areas are uniformly distributed so that the base distributed resistance is uniform across the base region. Furthermore, it is crucial to the present invention that the base contacts be located precisely at the middle of any two neighboring emitters in order to avoid localization of current in the base region. Structure of transistor 50 after completion of this step is shown in FIG. 5E.

Figure 5E:
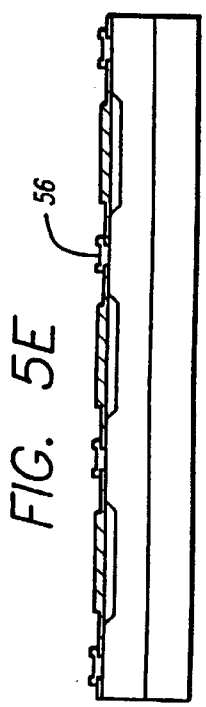

Next, referring to FIG. 5F, a blanket of interlayer dielectric 78 is formed over the structure shown in FIG. 5E. This interlayer dielectric is typically a deposited silicon oxide with a thickness of about 2000 Angstroms. The interlayer dielectric is used to insulate lower metal layer 56 from upper metal layer 52 which will be deposited in a later step.

Figure 5G:
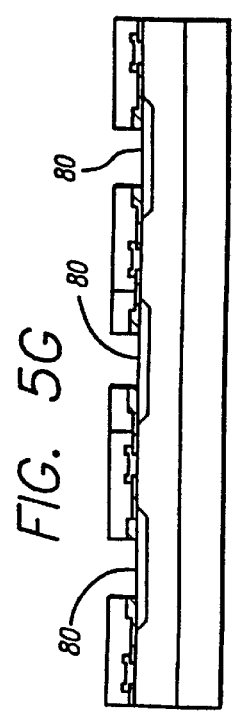

The next step is to use a mask to etch the interlayer dielectric over areas 80 intended to become emitter contacts as shown in FIG. 5G. The next step comprises depositing upper metal layer 52 over the entire transistor 50. Accordingly, emitter contact areas 80 are filled in with upper metal layer 52, thus forming emitter contacts 82. Upper metal layer 52 is typically a deposited aluminum layer with a thickness of about 5000 Angstroms. The structure of transistor 50 after completion of this step is shown in FIG. 5H. Finally, backside contacts (not shown) providing electrical connection to substrate 40 are formed.

As shown in FIG. 5H and FIG. 4, the top view of the physical transistor 50 consists of a large continuous square of upper metal layer 52 covering almost the entire transistor area. Electrical contact to this upper metal layer provides connection to the emitter node of transistor 50. Lower metal layer 56 is exposed at the edges of this large square to form a ring around the transistor. Electrical contact to this ring provides connection to the base node of transistor 50. Electrical contact with the backside contacts (not shown) of substrate 40 provides connection to the collector node of transistor 50.

Referring back to FIG. 3, when NPN transistor 50 is operated in the active mode, emitter islands 30 are connected to ground potential, base 32 is connected to a voltage of about +0.7 volts to forward bias the emitter-base junction, and collector 40 is connected to a voltage of about +5.0 volts to reverse bias the collector-base junction. For simplicity, attention is now turned to the operation of the physical area confined by dashed lines 36 which includes the center emitter island. The operation of the transistor under another emitter island is, however, the same as that explained below for the area confined by dashed lines 36.

Focusing on the "transistor action" occurring between dashed lines 36, emitter majority carriers, in this case electrons, are injected into base 32 and are swept across the base-collector junction and collected by collector 40. Arrowed lines 38 show the direction of electron motion during active operation of transistor 50. As indicated above, the spacing between emitters is such that the current distribution is very uniform at the base collector junction. This causes the transistor to behave as having one continuous emitter from the point of view of total current capacity, and causes adjacent emitters to "share" the electric field in a fashion which prevents a single emitter from developing a "hot spot." Nevertheless, as seen in the area confined by dashed lines 36, the current density in the base and collector regions is substantially uniform since electron current is spread out substantially uniformly inside the base region confined by dashed lines 36. Accordingly, a large current can be obtained without developing a thin filament of current which would exclude the central base and collector regions under emitter 30.

Figure 6B:
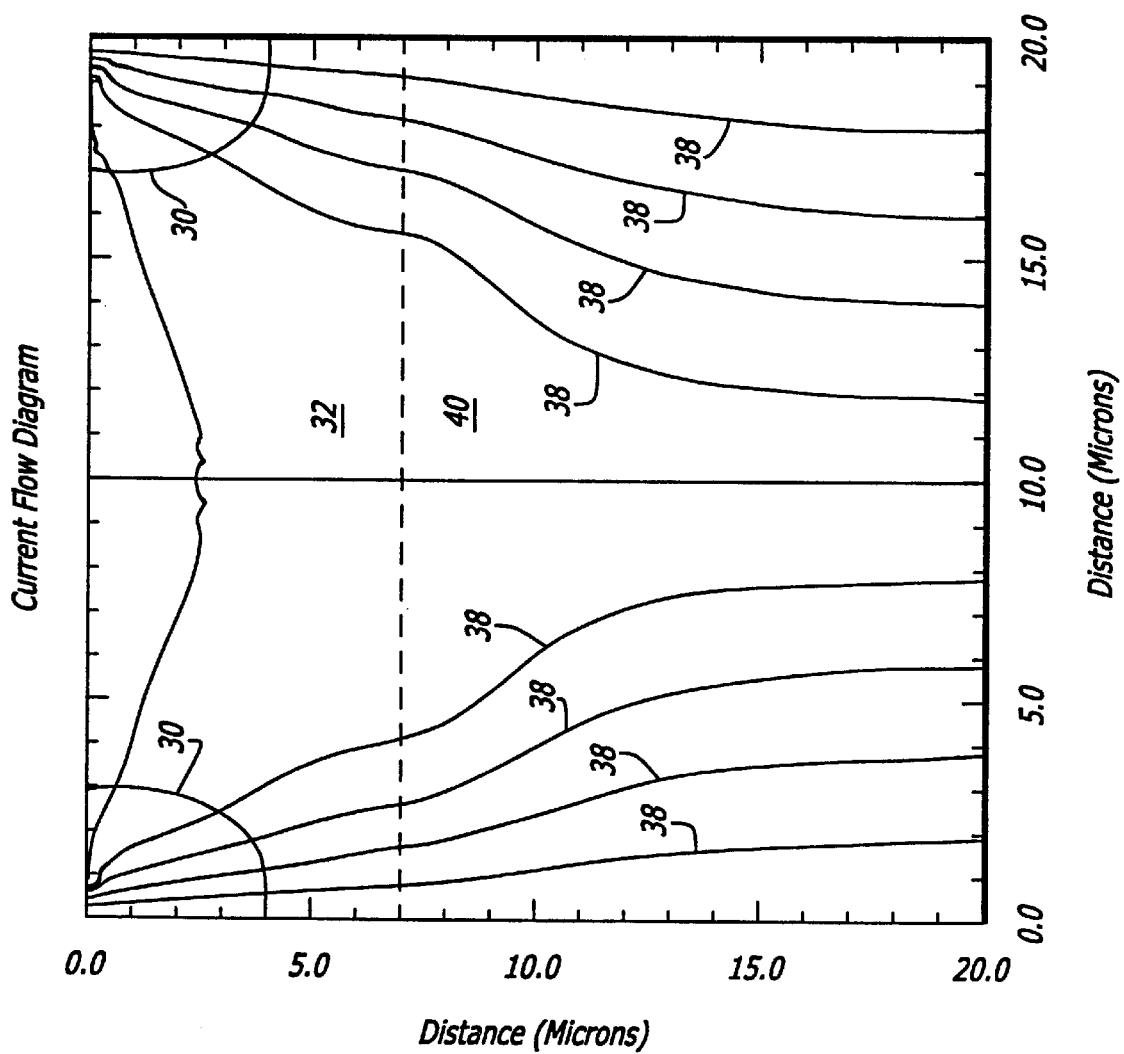
Figure 6C:
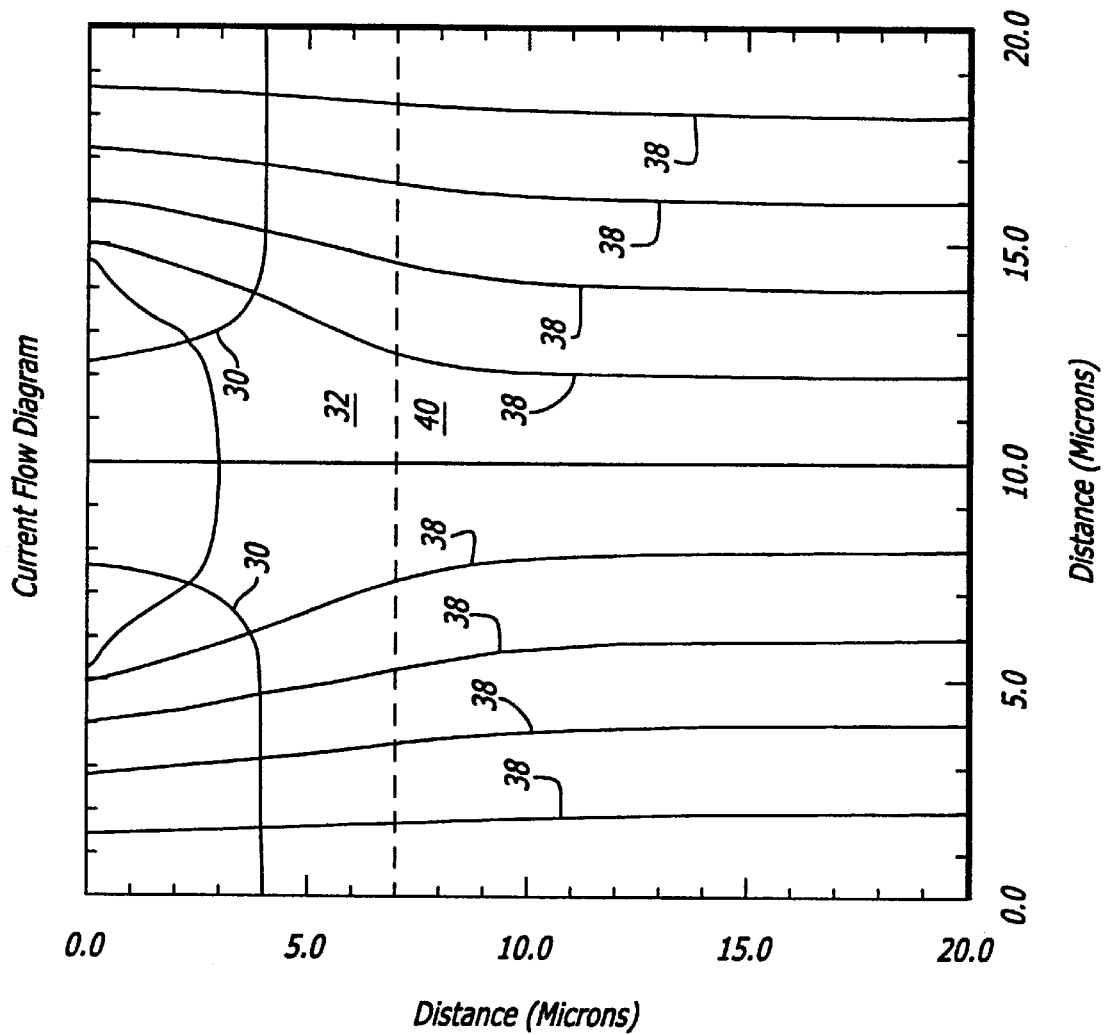

By way of comparison, FIGS. 6A–6C are current flow diagrams which illustrate the shortcoming of the conventional bipolar transistors and the advantages realized by the present invention. As shown in FIGS. 6A and 6B, the electron current shown by arrowed lines 38 is diverted from the emitters 30 concentrating at the corners of the emitters as shown. For this reason, the current density under emitters 30 is not uniform. As such, even before a large collector current is obtained, a thin filament of current emanating from the corners of emitter 30 may develop, while no current conduction is performed under the center of emitter 30. The likelihood of developing a "hot spot" causing device failure is reduced by placing the emitters of the transistor in closer proximity to each other as shown in FIGS. 6B and 6C. FIG. 6B shows an intermediary effect on current density through reduction of the emitter separation distance.

Referring now to FIG. 6C, the invention has overcome this shortcoming so that the entire region below the central portion of emitter 30 conducts a substantial amount of current to greater reduce the likelihood of developing a hot spot. As shown in FIG. 3, this is achieved by optimally spacing the neighboring emitters in relation to the thickness of base 32 and further by maintaining a symmetrical topology by the self-aligned formation of emitter islands 30 and the base contacts. According to the invention, emitter islands 30 are optimally spaced so that the current emanating from the corners of a given emitter island 30 would fill base and collector regions of the space between adjacent islands in a fashion to provide a uniform current distribution and to distribute by-product heat. As such, the entire base and collector regions below the center of a given emitter island 30 conduct the emitter majority carrier current in a substantially uniform manner. Therefore, the current density below each emitter island is substantially uniform and the transistor as a whole can conduct a higher total current. Furthermore, according to the invention, a uniform current flow is established before the carriers move out of the-base region. This inhibits formation of current filaments because the electric field in the collector region is uniform. This also prevents "hot spot" effects seen in the prior art transistors.

It is noted that emitter islands 30 are spaced in relation to the base thickness such that the spacing does not exceed the base thickness. That is, for a shallow base, the emitters are normally spaced closer to one another; for a deep base, the emitters may be spaced further apart. The reason is that for a shallow base, the electron currents originated from the corners of neighboring emitter islands spread out after traversing a small base depth. Such electron currents contribute to the current density of the base and collector regions under an emitter spaced closely to the originating emitters. For a deeper base, the current spreads out after traversing a large base depth and can only contribute to current density of base and collector regions under a distant emitter. In a preferred embodiment of the invention, the base depth labeled "b" is approximately seven microns while the emitter separation distance labeled "a" is equal to the base depth, namely seven microns. It is contemplated, however, that the emitter separation distance ("a") may be less than the base depth ("b").

Figure 1A:
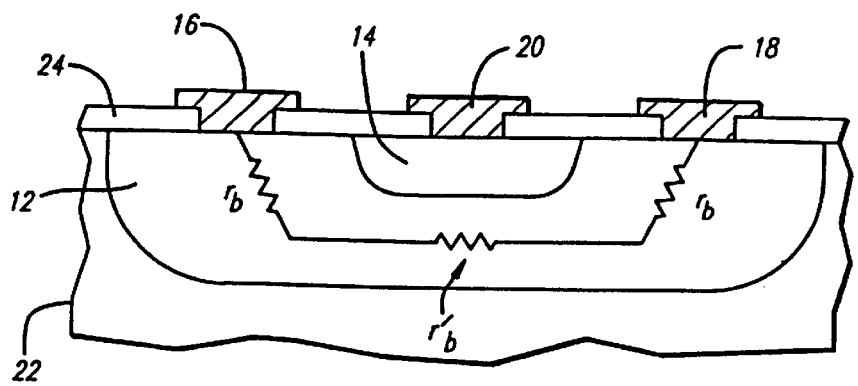
FIG. 1A illustrates a prior art transistor structure and the base distributed resistance.
Figure 1B:
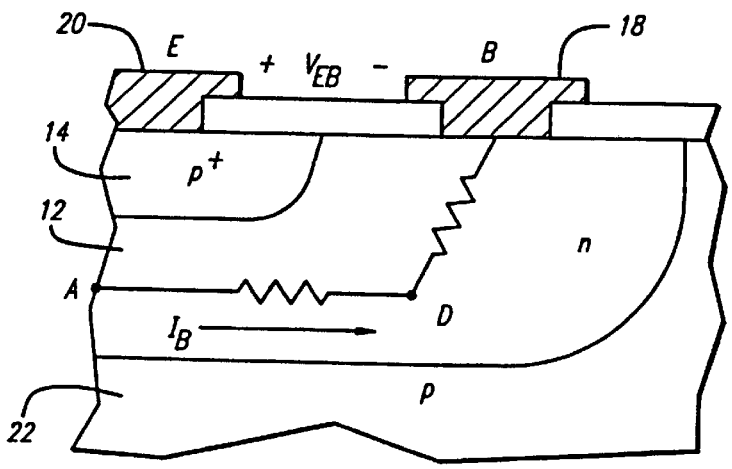
FIG. 1B illustrates a prior art transistor structure and variations of potential within the base region.
Figure 2:
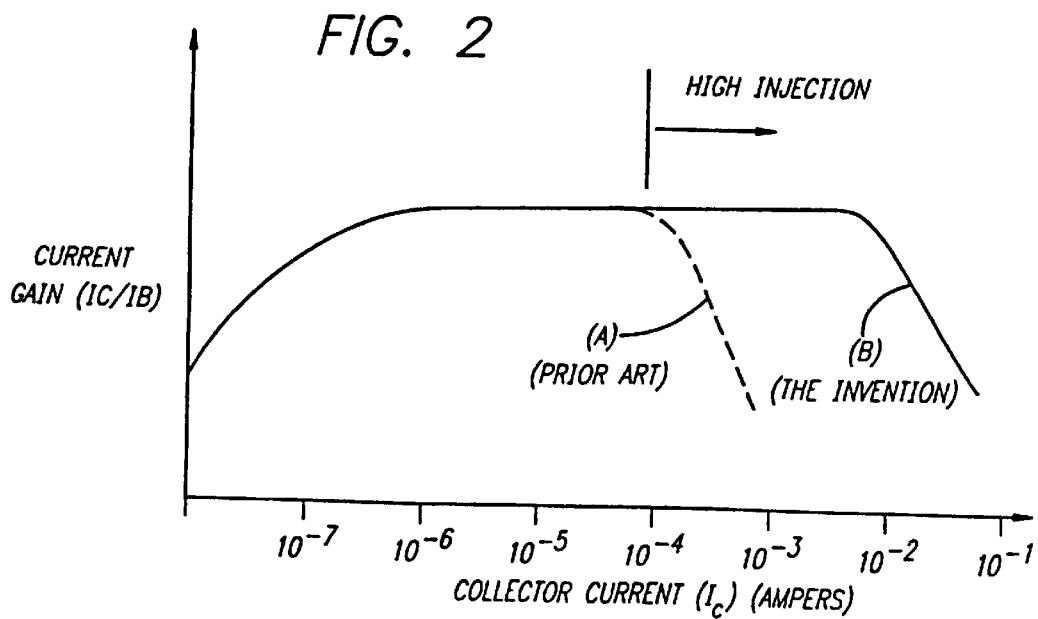
FIG. 2 is graphical illustration of the fall-off of the prior art's bipolar transistor current gain at high collector currents represented by curve (A) and the delayed fall-off of transistor current gain according to the present invention as represented by curve (B).

The uniform current density under emitter islands 30 of the present invention eliminates the early fall-off of the prior art's transistor current gain. The reason is that transistor 50 of the present invention can conduct a large current through the base region directly under each emitter island. Thus, unlike the prior art, the base majority carrier density does not disproportionately increase in the regions of the base next to the corners of the emitter. To the contrary, the current is uniformly spread in the base region under an emitter island. Thus, the emitter injection efficiency is preserved for large collector currents. This in turn causes the transistor current gain to be maintained at large collector currents. In other words, the current gain of the transistor of the present invention is larger than the prior art's current gain at large collector currents. Curve (B) in FIG. 2 illustrates the increase in transistor current gain of the invention as compared with the transistor current gain of the prior art. Since transistor 50 of the present invention maintains its current gain for high collector currents, the transistor is particularly suitable for power applications where the prior art suffers from a fall-off in current gain.

As discussed above, the prior art employs added resistance, called ballast resistors, in the emitters, the base, or both to prevent current from concentrating into any single point in the transistor structure, thereby providing improved safe operating area (SOA) performance. This technique causes a degradation in the saturation voltage, and in the current gain performance. The present invention does not use any added resistance, but rather accomplishes the improved SOA performance by causing the current flow to become uniform within the base region, or adjacent to the base junction. This uniform current distribution prevents any single emitter from carrying excess current.

Thus, the present invention improves the SOA performance in bipolar transistors at both low and high current levels without sacrificing other performance characteristics. The invention results in a transistor which eliminates the need for ballast resistors, thereby providing improved SOA performance without the limitations caused by the added resistance of ballast resistors.

As stated above, maintaining a symmetrical topology of emitter islands 30 and the base contacts is crucial to successful operation of the transistor of the present invention. The symmetrical topology is achieved by the self-aligned masking step that requires a single mask to define both emitter areas 76 (FIG. 5B) and base contact openings 74 (FIG. 5D). If the base contacts are not precisely centered between neighboring emitter islands, the base distributed resistance becomes smaller for some emitters and larger for others. This causes concentration of electron current near the emitter regions facing a smaller base distributed resistance. This in turn causes development of current filaments such that current density in the base and collector regions would no longer be uniform. Accordingly, the high current gain advantages of the present invention would be lost. A similar problem occurs when an emitter island is fabricated closer to a base contact than a neighboring emitter island. This also causes a difference in the resistive path from the base contact to these two emitters. This in turn results in the non uniform current distribution discussed above.

While the preferred embodiments have been described and illustrated, various modifications and substitutions may be made thereto without departing from the scope of the invention. Accordingly, it should be understood that the present invention has been described by way of illustration and not limitation. For example, the principles taught by the present invention apply equally well to PNP transistors. Further, the thickness of emitter islands and the base, and the emitter separation distance can be modified. The doping levels and thicknesses of various layers can also be modified without departing from the scope of the present invention. Further, while certain impurities have been specifically mentioned, other donor or acceptor impurities known in the art can be used. Also, although the invention has been described for a silicon substrate, the semiconductor can be germanium or gallium arsenide as well.

Thus, a uniform current density and high current gain bipolar transistor has been described.

What is claimed is:

1. A transistor comprising:

a collector region;

a base region having a base thickness and formed on one side of the collector region; and a plurality of emitter islands formed within the base region, each of the emitter islands being separated from a neighboring emitter island by an emitter separation distance which is not greater than the base thickness.

2. The transistor of claim 1, wherein the base thickness is equal to at least seven microns.

3. The transistor of claim 1, wherein the emitter separation distance is of a distance so that current density in the base and collector regions is substantially uniform.

4. The transistor of claim 1 further comprising:

a plurality of emitter contacts; and an upper metal layer interconnecting the plurality of emitter contacts, each of the plurality of emitter contacts being formed on a top side of a respective one of the plurality of emitter islands.

5. The transistor of claim 4 further comprising a plurality of base contacts formed on the base region, the plurality of base contacts being uniformly separated from each of the plurality of emitter contacts, the base contacts further being interconnected by a lower metal layer.

* * * * *